(12) United States Patent
Loopstra et al.

(10) Patent No.: US 8,537,330 B2
(45) Date of Patent: Sep. 17, 2013

(54) LITHOGRAPHIC APPARATUS, DEVICE MANUFACTURING METHOD AND COMPUTER READABLE MEDIUM

(75) Inventors: Erik Roelof Loopstra, Eindhoven (NL); Marius Ravensbergen, Bergeijk (NL); Franciscus Johannes Joseph Janssen, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 338 days.

(21) Appl. No.: 13/004,557

(22) Filed: Jan. 11, 2011

(65) Prior Publication Data

US 2011/0176121 A1 Jul. 21, 2011

Related U.S. Application Data

(60) Provisional application No. 61/295,294, filed on Jan. 15, 2010, provisional application No. 61/309,565, filed on Mar. 2, 2010.

(51) Int. Cl.
*G03B 27/52* (2006.01)
*G03B 27/42* (2006.01)

(52) U.S. Cl.
USPC .................................. 355/30; 365/53

(58) Field of Classification Search
USPC ................. 355/30, 52, 53, 67; 359/820, 846, 359/848
See application file for complete search history.

(56) References Cited

U.S. PATENT DOCUMENTS

| | | | |
|---|---|---|---|
| 6,859,259 B2 * | 2/2005 | Bakker et al. | 355/53 |
| 7,397,531 B2 * | 7/2008 | Franken | 355/30 |
| 2002/0074115 A1 * | 6/2002 | Dieker | 165/201 |

* cited by examiner

*Primary Examiner* — Hung Henry Nguyen
(74) *Attorney, Agent, or Firm* — Pillsbury Winthrop Shaw Pittman LLP

(57) ABSTRACT

In a lithographic apparatus, a part of a reflector is heated and cooled. The rate of heating and/or the rate of cooling is adjusted to adjust the temperature of the part. The change in temperature of the part exerts a force on the reflector, which changes its shape.

18 Claims, 5 Drawing Sheets

LITHOGRAPHIC APPARATUS, DEVICE MANUFACTURING METHOD AND COMPUTER READABLE MEDIUM

CROSS-REFERENCE TO RELATED APPLICATIONS

This application claims the benefit of priority from U.S. Provisional Patent Application Nos. 61/295,294, filed Jan. 15, 2010, and 61/309,565, filed Mar. 2, 2010, the contents of which are both incorporated herein by reference in their entireties.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 10-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

In lithographic apparatus using EUV as the projection beam, transmissive optical elements cannot be used to shape the illumination beam or project the patterned beam onto the substrate because there are no suitable materials transmissive to EUV. Known illumination and projection systems for EUV radiation therefore comprise reflectors, either grazing incidence mirrors or normal incidence multilayer mirrors (also known as distributed Bragg reflectors). These types of mirrors have reflectivities significantly less than 100% so that a significant amount of energy is absorbed by each reflector. At many of the reflectors, the beam intensity is not uniformly distributed across the reflector leading to non-uniform heating thereof. Even though the substrate of a reflector may be made of a material, such as Zerodur™ or ULE™, with a very low coefficient of thermal expansion (CTE), the non-uniform heating may lead to undesirable distortions of the substrate and the reflective surface of the reflector.

An analogous condition, known as lens heating, occurs in lithographic apparatus using DUV as the exposure radiation. Various methods have been proposed to deal with lens heating in DUV lithographic apparatus, including: active cooling by flushing the lens systems with temperature controlled gas; heating parts of lenses that are not heated by the beam to ensure a uniform temperature distribution in the lens; and mechanically distorting lenses using Lorenz actuators mounted to the edges of the lenses. These approaches are not, however, easily transferred to EUV reflectors. Because an EUV optical system is maintained in vacuum, the reflective surfaces of the reflectors cannot be cooled by gas whilst active cooling of the rear surfaces is not effective in eliminating temperature variations and may introduce unacceptable mechanical disturbances. Applying additional heat to ensure a uniform heat load on a reflector is undesirable due to the difficulties of cooling optical systems in vacuum. It has been found that available actuators are not capable of applying sufficient force to a typical EUV reflector to correct its shape.

SUMMARY

It is desirable to provide a lithographic apparatus having an EUV reflector capable of maintaining a correct surface figure in spite of an uneven heat load, e.g. from the radiation beam.

According to an aspect of the invention, there is provided a lithographic apparatus that includes an optical system configured to condition a radiation beam, to direct the radiation beam onto a patterning device, and to project a pattern from the patterning device onto a substrate. The optical system has a reflector that includes a thermal actuator comprising a cooler arranged to cool a part of the reflector and a heater arranged to heat the part of the reflector, and the lithographic apparatus further has a control system arranged to control the thermal actuator to change relative amounts of heating and cooling applied to the part of the reflector so as to apply a force to the reflector.

According to an aspect of the invention, there is provided a lithographic method for manufacturing a device. The method includes using an optical system to condition a radiation beam, to direct the radiation beam onto a patterning device, and to project a pattern from the patterning device onto a substrate. The optical system has a reflector comprising a thermal actuator comprising a cooler arranged to cool a part of the reflector and a heater arranged to heat the part of the reflector. During use of the optical system the radiation beam traverses a reflective surface of the reflector, and the method further includes heating a part of the reflector, and cooling the part of the reflector, and adjusting a rate of the heating and/or the cooling of the part to change a temperature of the part and exert a force on the reflector to change a shape of the reflective surface.

According to an aspect of the invention, there is provided a computer readable medium that includes a computer readable memory storing instructions for controlling a lithographic apparatus comprising an optical system configured to condition a radiation beam, to direct the radiation beam onto a patterning device, and to project a pattern from the patterning device onto a substrate. The optical system has a reflector comprising a thermal actuator comprising a cooler arranged to cool a part of the reflector, and a heater arranged to heat the part of the reflector. The instructions are arranged to be effective to perform a method comprising adjusting a rate of the heating of the part and/or the cooling of the part to change a temperature of the part and exert a force on the reflector to change a shape of the reflective surface.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
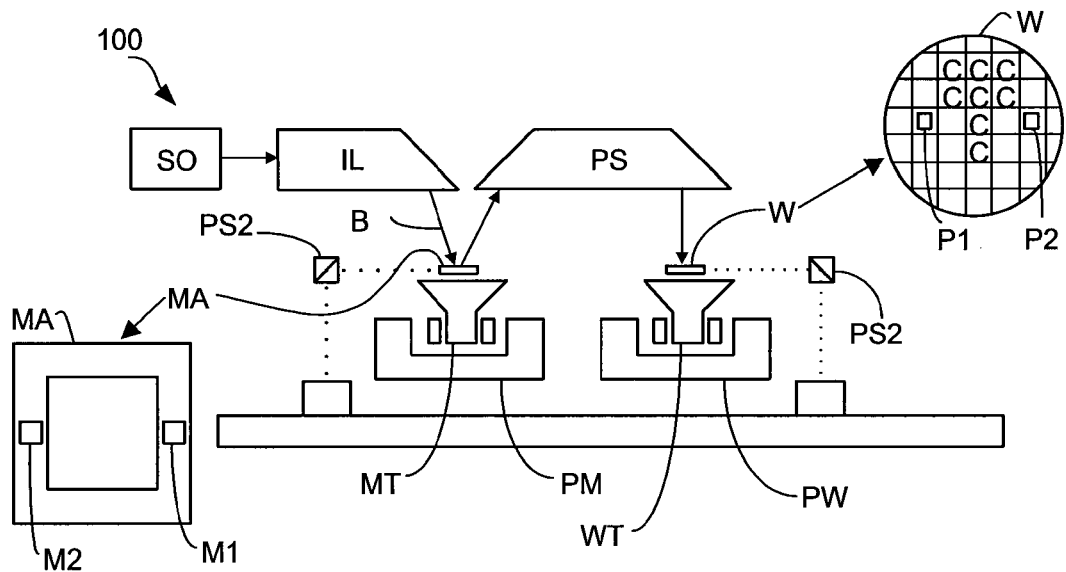
FIG. 1 depicts a lithographic apparatus according to an embodiment of the invention.

FIG. 1 schematically depicts a lithographic apparatus 100 including a source collector module SO according to an embodiment of the invention. The apparatus comprises an optical system configured to condition a radiation beam B, to direct the radiation beam B onto a patterning device MA, and to project a pattern from the patterning device MA onto a substrate W. The optical system comprises an illumination system (illuminator) IL configured to condition the radiation beam B (e.g. BUY radiation); a support structure (e.g. a mask table) MT constructed to support the patterning device (e.g. a mask or a reticle) MA and connected to a first positioner PM configured to accurately position the patterning device; a substrate table (e.g. a wafer table) WT constructed to hold the substrate (e.g. a resist-coated wafer) W and connected to a second positioner PW configured to accurately position the substrate; and a projection system (e.g. a reflective projection system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source collector module SO may be part of an EUV radiation system including a laser, not shown in FIG. 1, for providing the laser beam exciting the fuel. The resulting plasma emits output radiation, e.g., EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illuminator IL may comprise an adjuster for adjusting the angular intensity distribution of the radiation beam. Desirably, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
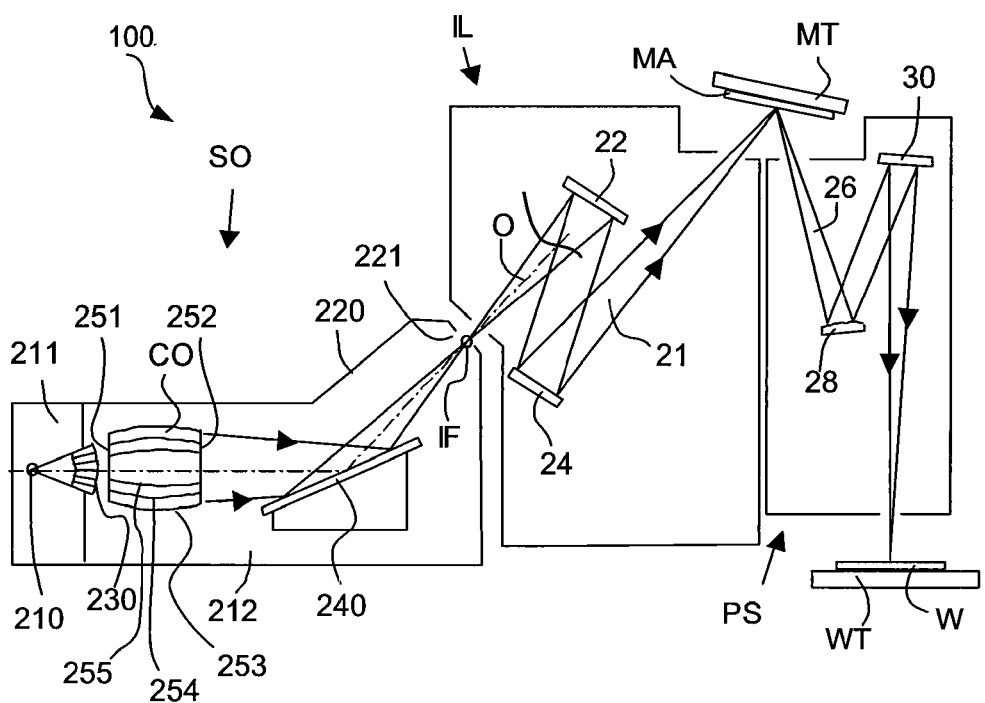
FIG. 2 is a more detailed view of the apparatus of FIG. 1.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module is arranged such that the intermediate focus IF is located at or near an opening 221 in the enclosing structure 220. The virtual source point IF is an image of the radiation emitting plasma 210.

Subsequently, the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
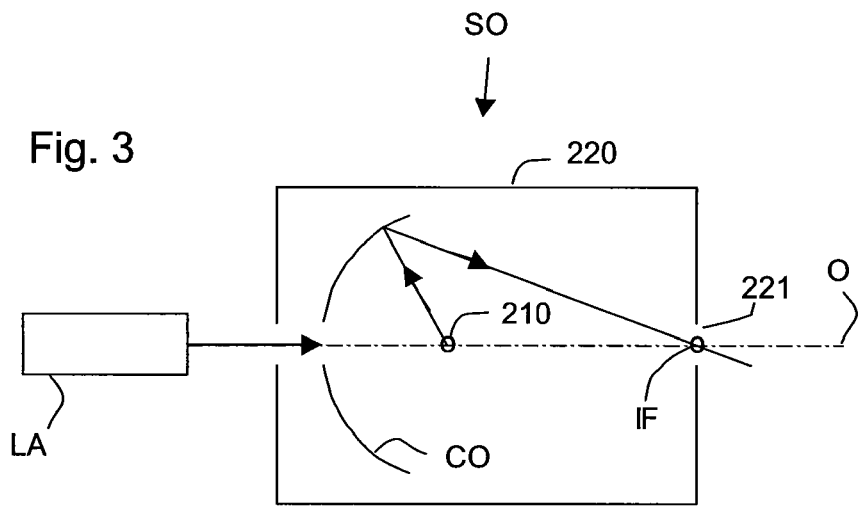
FIG. 3 is a more detailed view of a source collector module of the apparatus of FIGS. 1 and 2.

Alternatively, the source collector module SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

Figure 4:
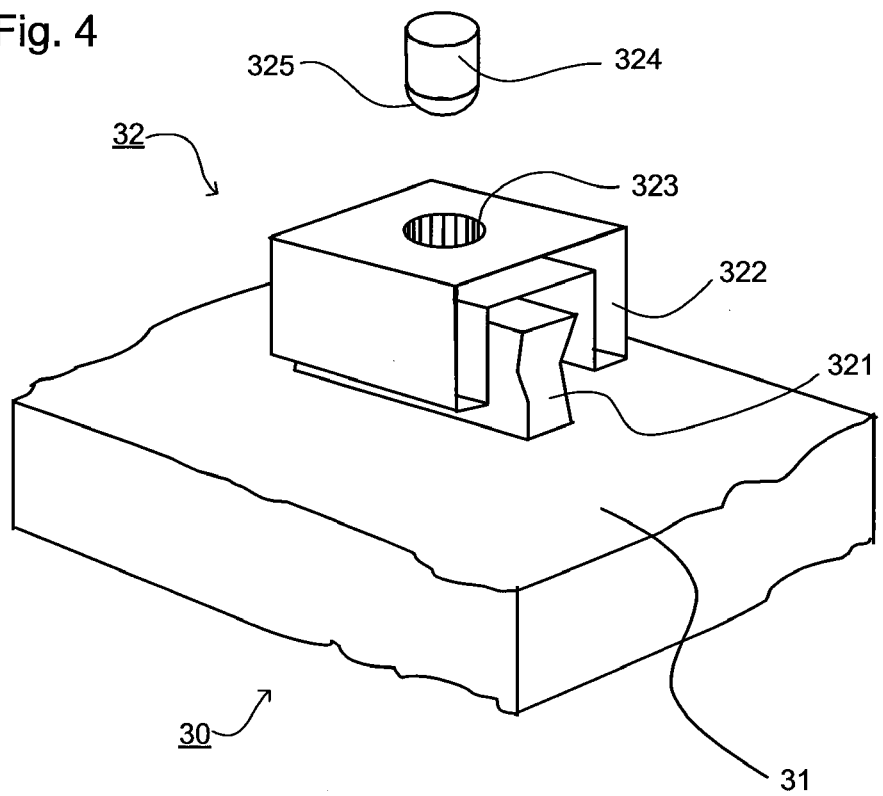
FIG. 4 depicts a part of a reflector according to an embodiment of the invention, showing a thermal actuator.

FIG. 4 is a schematic diagram showing a thermal actuator 32 of an embodiment of the invention for applying a controlled force to the rear surface 31 of a reflector 30 in order to correct its surface figure. Although the thermal actuator is shown as applied to a reflector in the projection system PS, the invention may also be applied to other reflectors in an EUV lithography apparatus, including reflectors in the source collector module and illumination system.

The purpose of the thermal actuator 32 is to correct the surface figure of the front (reflective) surface of the reflector 30. Distortions of the surface figure may arise, for example, due to a non-uniform temperature profile in the reflector. The non-uniform temperature profile may arise through non-uniform heating of the reflector by the illumination beam, a significant fraction of the energy of which is absorbed by the reflector. Other heat sources in the lithographic apparatus and non-uniform cooling may also contribute to the non-uniform temperature distribution of the apparatus. Embodiments of the present invention can also be used to correct errors in the surface figure of the mirror that may arise from some other source. In addition, the invention may be used to apply changes to the surface figure that deviate from its nominal shape in order to correct an aberration or wavefront error in the projected patterned radiation beam B arising from some other source or component. Where embodiments of the invention are used to correct for distortions caused by uneven heating by the radiation beam, the effects of the uneven heating may be predicted by a suitable computer simulation. Alternatively, they may be measured, e.g. by an interferometric sensor that measures the surface figure of the reflector.

Thermal actuator 32 operates by simultaneously heating and cooling a part 321 of the reflector 30. In the rest state, when no force is to be applied to the reflector 30, the heating and cooling are balanced, so that the same amount of heat energy is removed from the part 321 of the reflector 30 as is supplied thereto. To apply an expansive force, the heating is increased and/or the cooling is decreased. To apply a contractive force, the heating is decreased and/or the cooling is increased. An appropriate control system to effect these changes is described below. By using simultaneous heating and cooling of part 321, large temperature differences can be established between the part and a heater and between the part and a cooler. Such large temperature differences increase the rate of heat transfer, making the device more responsive. Nevertheless, by balancing and heating and cooling in the rest state, no net heat load is applied to the substrate.

In an embodiment of the invention, the part to be cooled and heated is a ridge 321 attached to the rear surface 31 of the reflector 30. Desirably, the ridge 321 is formed integrally with the substrate of the reflector by molding or machining. Alternatively the ridge 321 may be attached to the reflector 30 by adhesive or mechanically. Instead of a ridge, attached to or integral with the reflector along its whole length, a bridge attached to the reflector only at its ends and optionally at separate points along its length may be used.

In an embodiment, a layer, e.g. a coating, of a material, such as aluminum or silicon, having a higher coefficient of thermal expansion (CTE) is applied to the rear surface 31. The additional material can be applied as a continuous layer on the back surface, which can be shaped as described above, or a series of discrete parts corresponding to the separate thermal actuators 32. The additional material can take the form of ridges or bridges as described above. The purpose of the additional material is to obtain a greater response from a given temperature change.

In this embodiment, the ridge 321 is cooled by a cooling channel 322 through which temperature controlled fluid, e.g. water at 22° C., is circulated. The cooling channel 322 desirably surrounds the ridge 321 on three sides but does not contact the ridge 321 or the reflector 30. In this way, no mechanical disturbances due to the circulation of the fluid in the cooling channel 322 can be transmitted to the reflector 30. The ridge 321 is cooled by thermal radiation to the cooling channel when the cooling channel is at a lower temperature than the ridge. The ridge, or at least parts thereof, may be treated, e.g. by painting or coating, to maximize thermal radiation therefrom. A gas, e.g. $H_2$, may be circulated in the gap between cooling channel and ridge to increase the heat transfer. By applying the controlled heating and cooling to ridge 321, the temperature change that is effected is concentrated in a small part so that a smaller heat transfer is effective to cause a large temperature change than if the whole of the rear surface of the reflector 30 were to be heated. Heating and cooling only a ridge, also avoids applying a heat load to the substrate of the reflector 30 and avoids creating further non-uniformities in its temperature distribution.

In this embodiment, the ridge 321 is heated by a radiative heater 324 which directs heat onto the ridge 321 through a through-hole 323 in the cooling channel 322. If the cooling channel and cooling fluid are sufficiently transparent to the radiation emitted by the radiative heater 324, the through-hole may be omitted. Desirably, the radiative heater is provided with a lens or other optics to ensure that all the radiation it emits is directed onto the ridge 321. The radiative heater 324 may be an incandescent lamp, an LED or a laser diode. Desirably the surface of the ridge 321, at least where the radiation is incident, is treated, e.g. by painting or coating, to maximize absorption of the incident radiation. A single treatment that maximizes both absorption and emission of radiation may be applied to the whole ridge. In an embodiment, a resistance heater may be provided on the inner surface of the cooling channel 322, opposite the ridge 321. This arrangement also avoids the need for a hole in the cooling channel.

Desirably, the thermal actuator should be sufficient to achieve a controllable deformation of the front surface of the reflector by an amount in the range of about 1 nm to about 100 nm, about 1 nm to about 50 nm or about 1 nm to about 10 nm. Desirably, this deformation should be achieved in less than about 5 minutes, less than about 2 minutes or less than about 1 minute. To assist controllability, the temperature change required to affect the desired distortion is desirably greater than about 100 mK, greater than about 1 K or greater than about 10 K. Calculations show that with a 3 mm ridge, a temperature change of about 30 K in about 1 minute can cause a 24 nm deformation of the front surface of a reflector. Desirably, the temperature change is not applied to the body of the substrate of the reflector but to a structure formed or mounted thereon that then applies a force to the substrate. The aim of embodiments of the invention is not to effect a particular temperature distribution in the body or substrate of the reflector but to exert forces thereon to affect its shape.

Other forms of heating and coolers can be used in the invention. For example, resistive electric heaters can be mounted or deposited on the ridges or the backside of the reflector. A heater may be spaced apart from the reflector and $H_2$ gas circulated therebetween to increase thermal transfer.

Figure 5:
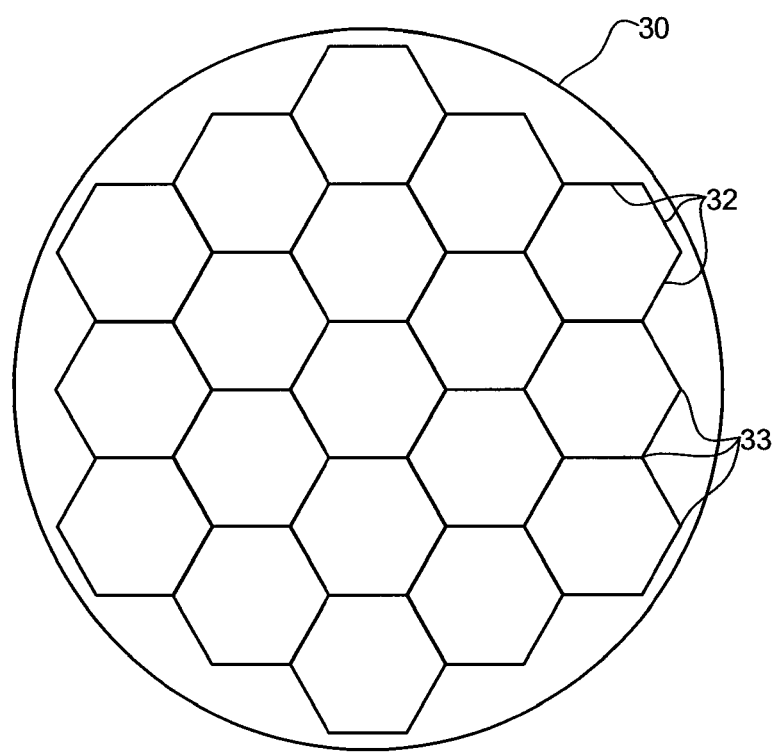
FIG. 5 depicts another reflector in an embodiment of the invention.

To enable control of the whole of the surface figure of the front (reflective) surface of the reflector 30, desirably a plurality of thermal actuators 32 are provided across the back surface. In an embodiment, the actuators 32 are disposed in a hexagonal pattern across the back surface 30 of the reflector as shown in FIG. 5. In this arrangement, three thermal actuators 32 effectively push or pull each vertex 33 in the network of actuators. A square network of actuators is also effective. The length of each actuator in the network may be in the range of from about 20 mm to about 50 mm. A hexagonal network can be desirable because the ratio of the space available for each actuator to the area operated on by each actuator is greater.

In an embodiment, a single cooler maintained at a constant temperature covering the entire rear surface and a plurality of separately controllable heaters arranged in a network may be provided.

Figure 6:
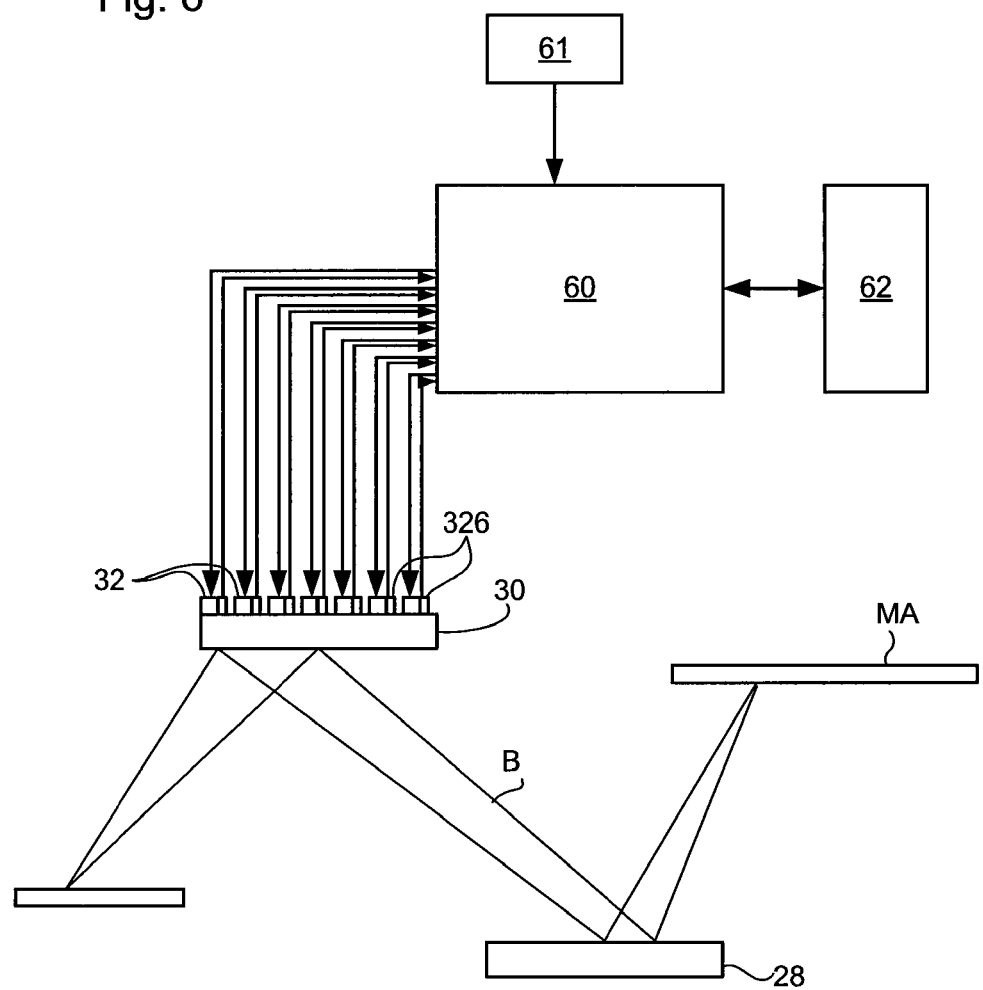
FIG. 6 depicts a control system in an embodiment of the invention.

A control system according to an embodiment of the invention is shown in FIG. 6. A controller 60, e.g. a microprocessor, receives information of a desired correction to the surface figure of the reflector 30 from an interface 61. Interface 61 may be a user interface allowing the operator to enter desired corrections or an interface to a main controller of the apparatus. Controller 60 may refer to memory 62 to determine temperature changes to be applied to the thermal actuators in order to effect the desired corrections. Memory 62 may store algorithms enabling the corrections to be calculated or pre-computed tables relating the desired corrections to the temperature changes. Desirably, the surface figure corrections to be applied are expressed in terms of Zernike polynomials. Desirably, the control system and actuator network should be capable of applying corrections up to and including Zernike polynomials of the $10^{th}$ order, the order of a Zernike polynomial being the sum of its radial order (highest power of r) and azimuth order (highest power of θ).

The controller 60 instructs each thermal actuator 32 to apply a temperature change to the relevant part of the reflector 30 in order to effect the desired figure change. The controller 60 can also receive signals from a plurality of temperature sensors 326 each associated with one of the thermal actuators 32 to effect a feedback control loop to ensure the correct temperature change is applied. Temperature sensors 326 may be provided on the ridge 321 or other formation to which the temperature change is applied. At least one temperature sensor can also be associated with the heater 325 and/or cooling channel 322. Multiple temperature sensors per thermal actuator 32 can be used.

Figure 7:
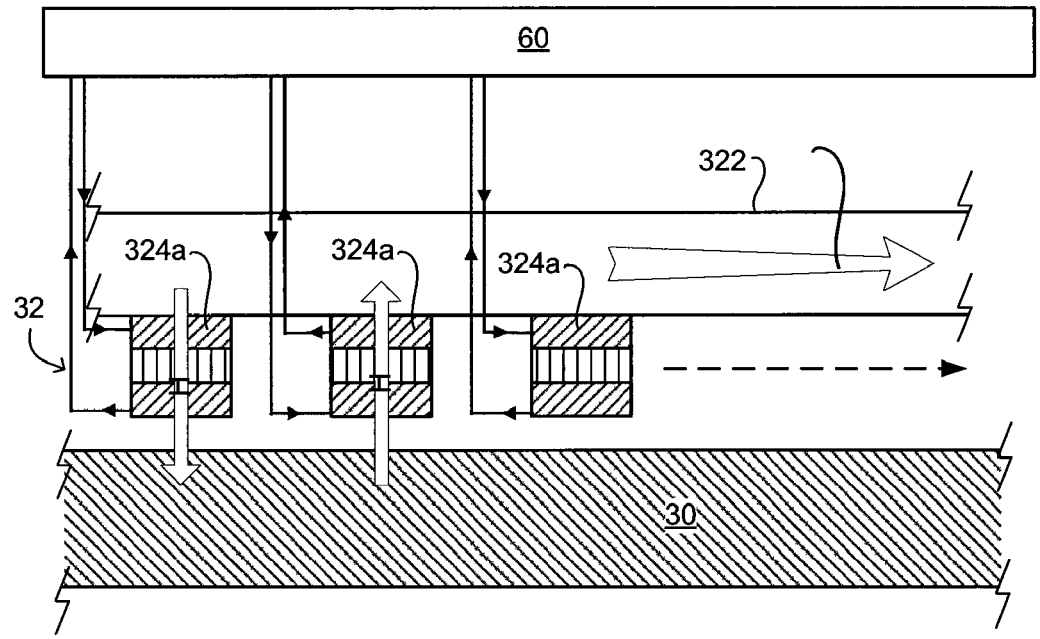
FIG. 7 depicts a part of a reflector according to an embodiment of the invention.

Another embodiment of the present invention is shown schematically in FIG. 7. In this embodiment, the cooler 322 comprises a large channel through which coolant CL, e.g. ultra pure water, may flow. The cooler 322 is shared between a plurality of thermal actuators 32. For example, a single cooler 322 may provide cooling to all thermal actuators 32 on reflector 30. In another example, a plurality of cooling channels 322 are present, each providing cooling to a row or column of thermal actuators 32 forming part of an array. The heater of each thermal actuator 32 in this embodiment comprises a Peltier effect device 324a (also known as a thermal electric junction). The Peltier devices 324a are connected to control circuit 60 which controls the polarity and magnitude of a potential difference applied to each Peltier device. In this way, the direction and magnitude of heat flow H through the Peltier device can be controlled.

The Peltier device can either cause heat to flow towards the reflector 30 or away from the reflector 30 according to the polarity of the applied potential difference. The magnitude of the applied potential difference affects the magnitude of the heat flow, although not linearly as the Peltier device is of limited efficiency. As a result of this limited efficiency, the capacity of the cooler 322 to remove heat from the vicinity of the reflector 30 should be large. Suitable Peltier devices are commercially available from a variety of suppliers. As in earlier embodiments, the Peltier elements may be disposed in an array, e.g. a square array or a hexagonal array. The Peltier devices may be arranged to transfer heat to and from formations, e.g. ridges or bridges, formed on the back of the reflector 30 and may be shaped and arranged to maximize transfer to and from the substrate of reflector 30.

Figure 8:
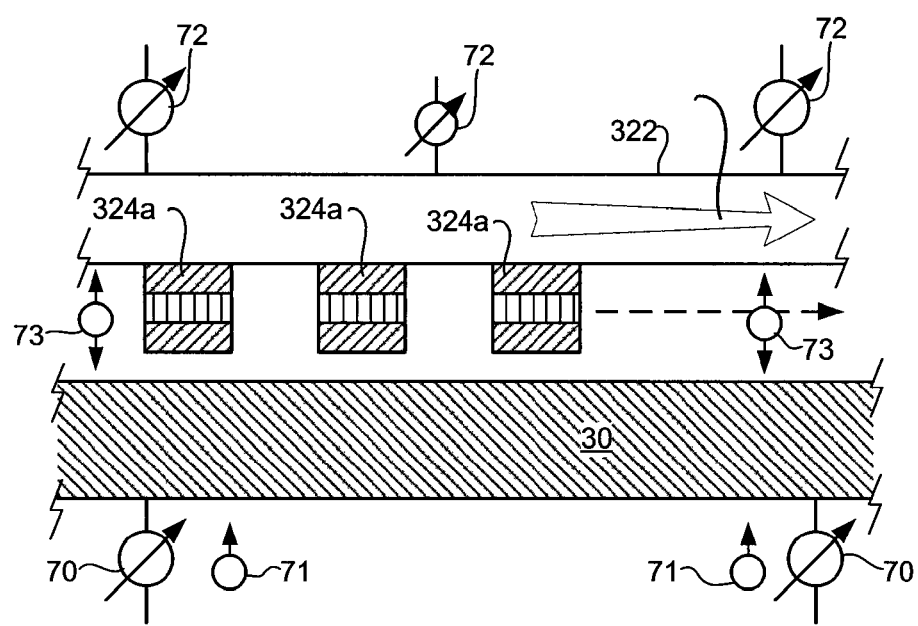
FIG. 8 depicts a part of a reflector according to an embodiment of the invention.

A further embodiment of the invention is shown in FIG. 8. This embodiment is the same as the embodiment described with relation to FIG. 7 except as noted below, although certain elements have been omitted from FIG. 8 for the sake of clarity.

In this embodiment, the reflector 30 is connected to a positioning device formed by actuator 70 and position sensors 71 in order to enable the position of reflector 30 to be finally controlled, e.g. to compensate for position changes resulting from thermal effects. A similar positioning device formed by actuator 72 is provided to position cooler 322 and attach Peltier elements 324a. Differential position sensors 73 are coupled to actuator 72 so as to maintain a constant separation between reflector 30 and cooling channel 322. In this way a consistent heat transfer can be effected.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, certain features of the invention may be embodied as a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus it will be apparent to one skilled in the art that modifications may be made to the invention as described without departing from the scope of the claims set out below.

What is claimed is:

1. A lithographic apparatus comprising:
    an optical system configured to condition a radiation beam, to direct the radiation beam onto a patterning device, and to project a pattern from the patterning device onto a substrate,
    the optical system having a reflector comprising
        a thermal actuator comprising a cooler arranged to cool a part of the reflector, wherein the part of the reflector is a projection extending from a rear surface of the reflector, opposite a reflective surface of the reflector, and
        a heater arranged to heat the part of the reflector, and
    a control system arranged to control the thermal actuator to change relative amounts of heating and cooling applied to the part of the reflector so as to apply a force to the reflector.

2. A lithographic apparatus according to claim 1, wherein the projection is an elongate ridge or bridge.

3. A lithographic apparatus according to claim 1, wherein the projection is formed integrally with a substrate or main body of the reflector.

4. A lithographic apparatus according to claim 1, wherein the part of the reflector has provided thereon a layer of material having a coefficient of thermal expansion higher than a coefficient of thermal expansion of the part of the reflector.

5. A lithographic apparatus according to claim 1, wherein the cooler is not in mechanical contact with the reflector.

6. A lithographic apparatus according to claim 5, wherein the thermal actuator comprises a positioning device arranged to adjust a position of the cooler relative to the reflector.

7. A lithographic apparatus according to claim 6, wherein the thermal actuator further comprises a position sensor arranged to detect the position of the cooler relative to the reflector and a position control system arranged to control the positioning device to maintain a constant position relative to the reflector.

8. A lithographic apparatus according to claim 1, wherein the heater comprises a radiative heater.

9. A lithographic apparatus according to claim 1, wherein the heater comprises a resistive electrical heater in thermal contact with the part of the reflector.

10. A lithographic apparatus according to claim 1, wherein the heater comprises a resistive electrical heater in thermal contact with the cooler.

11. A lithographic apparatus according to claim 1, wherein the heater comprises a Peltier device in thermal contact with the cooler.

12. A lithographic apparatus according to claim 11, wherein the control system is arranged to control a magnitude and a polarity of a potential difference applied to the Peltier device to selectively cause the Peltier device to pump heat energy from the reflector to the cooler or from the cooler to the reflector.

13. A lithographic apparatus according to claim 1, further comprising a plurality of thermal actuators arranged to exert forces on respective parts of the reflector.

14. A lithographic method for manufacturing a device, the method comprising:
    conditioning a radiation beam using an optical system;
    directing the radiation beam onto a patterning device using the optical system;
    projecting a pattern from the patterning device onto a substrate using the optical system, the optical system having a reflector comprising a thermal actuator comprising a cooler arranged to cool a part of the reflector, and a heater arranged to heat the part of the reflector, the radiation beam traversing a reflective surface of the reflector;
    heating the part of the reflector, wherein the part of the reflector is a projection extending from a rear surface of the reflector, opposite a reflective surface of the reflector;
    cooling the part of the reflector; and
    adjusting a rate of the heating of the part and/or the cooling of the part to change a temperature of the part and to exert a force on the reflector to change a shape of the reflective surface.

15. A lithographic method according to claim 14, wherein the adjusting is performed in response to a predicted or measured change in the shape of the reflective surface due to uneven heating of the reflective surface and the force exerted on the reflector is effective to at least ameliorate the change in shape due to uneven heating.

16. A lithographic method according to claim 15, wherein the change in shape due to uneven heating is predicted.

17. A lithographic method according to claim 15, wherein the change in shape due to uneven heating is measured.

18. A source-collector module comprising:
    a reflector comprising
        a thermal actuator comprising a cooler arranged to cool a part of the reflector, wherein the part of the reflector is a projection extending from a rear surface of the reflector, opposite a reflective surface of the reflector, and
        a heater arranged to heat the part of the reflector, and
    a control system arranged to control the thermal actuator to change relative amounts of heating and cooling applied to the part of the reflector so as to apply a force to the reflector.

* * * * *